(12) United States Patent
Hsu et al.

(10) Patent No.: US 6,444,517 B1
(45) Date of Patent: Sep. 3, 2002

(54) HIGH Q INDUCTOR WITH CU DAMASCENE VIA/TRENCH ETCHING SIMULTANEOUS MODULE

(75) Inventors: Heng-Ming Hsu, Hsin Chu; Shyh-Chyi Wong, Taichang; Chaochieh Tsai, Hsin-Chu; Ssu-Pin Ma, Taipei; Chao-Cheng Chen; Liang-Kun Huang, both of Tainan, all of (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 10/055,091

(22) Filed: Jan. 23, 2002

(51) Int. Cl.[7] ........................................... H01L 21/8244
(52) U.S. Cl. ..................... 438/238; 438/381; 438/675
(58) Field of Search ................................. 438/238, 381, 438/629, 672, 675

(56) References Cited

U.S. PATENT DOCUMENTS

| | | | |
|---|---|---|---|
| 5,652,173 A | 7/1997 | Kim | 437/60 |
| 5,801,100 A | 9/1998 | Lee et al. | 438/678 |
| 6,030,877 A | 2/2000 | Lee et al. | 438/381 |
| 6,054,329 A | 4/2000 | Burghartz et al. | 438/3 |
| 6,309,922 B1 * | 10/2001 | Liu et al. | 438/238 |

\* cited by examiner

Primary Examiner—H. Jey Tsai
(74) Attorney, Agent, or Firm—George O. Saile; Stephen B. Ackerman

(57) ABSTRACT

A new method is provided for the creation of an inductive over the surface of a semiconductor substrate. A first layer of metal is created in a layer of dielectric, a second layer of metal is created overlying the first layer of metal. The first layer of metal combined with the second layer of metal form an inductor of increased height, reducing the resistivity of the inductor, increasing the Q value of the inductor. The new method of creating an inductor can be combined with creating contact points that connect to contact points in the active region of the surface of a semiconductor substrate.

31 Claims, 3 Drawing Sheets

HIGH Q INDUCTOR WITH CU DAMASCENE VIA/TRENCH ETCHING SIMULTANEOUS MODULE

BACKGROUND OF THE INVENTION (1) Field of the Invention

The invention relates to the fabrication of integrated circuit devices, and, more particularly, to a method for the creation of a high Q value spiral inductor by increasing the metal thickness of the inductor.

(2) Description of the Prior Art

Integrated Circuits (IC's) are typically formed in or on the surface of a semiconductor substrate whereby electrical circuit elements of the individual IC's are connected internally to the semiconductor surface on which the IC's are formed. IC's that are formed in or on the surface of a substrate are mostly active digital processing devices without therefrom however excluding analog processing devices. In addition, discrete passive components can be formed that ate functionally cooperative with active semiconductor devices and that may or may not have been formed using semiconductor devices technology techniques and equipment.

Semiconductor device performance improvements are largely achieved by reducing device dimensions. This trend of device miniaturization has progressed to where modern day devices are created with sub-micron device feature size. While this process has been a continuing trend for active semiconductor devices it has placed increased emphasis on miniaturization of discrete passive components that are required to function with the miniaturized active devices. To accommodate the requirements that are placed on further reductions of the dimensions of discrete passive components, the methods used and the designs of these components can be changed while another path of development has focused on using materials that provide improved performance of the discrete components. With respect to using more promising materials for the creation of discrete components in order to improve component performance, recent trends have focused on replacing conventional aluminum as the conductive medium with copper. As wire widths in integrated circuits continue to shrink, the electrical conductivity of the wiring material itself becomes increasingly more important. Thus, in this regard, aluminum, which has been the material of choice since the integrated circuit art began, is becoming less attractive than other better conductors such as copper, gold and silver. Copper does provide the advantages of improved conductivity and reliability but does as yet provide a challenge where a layer of copper must be etched using conventional methods of photolithography and reactive ion etching (RIE). This is due to the fact that copper does not readily form volatile species during the process of RIE. To circumvent these problems, other methods of creating interconnect lines using copper have been proposed such as depositing the copper patterns using methods of Chemical Vapor Deposition (CVD) of selective electroless plating. The composition of the deposited layer of metal, if the preferred element contained in the layer of metal is copper, can be changed by the addition of other metallic substances in order to improve deposition results. The use of copper has recently found increased application in the creation of discrete components, most notably of discrete inductors that are formed above the surface of a semiconductor substrate. Copper has only recently gained more attention as an interconnect metal. Copper is of relatively low cost and low resistivity. Copper however also has a relatively large diffusion coefficient into surrounding dielectrics such as silicon dioxide and silicon. Copper has the additional disadvantage of being readily oxidized at relatively low temperatures, conventional photoresist processing can therefore not be used for copper because the photoresist needs to be removed at the end of the process by heating it in a highly oxidized environment. Copper from an electrical interconnect may diffuse into the surrounding layer of dielectric (such as a layer of silicon dioxide), causing the dielectric to become conductive while at the same time decreasing the dielectric strength of the silicon dioxide layer. Copper interconnects are therefore typically encapsulated by at least one diffusion barrier layer in order to prevent diffusion into the surrounding silicon dioxide layer. Silicon nitride can serve as a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. Copper further has low adhesive strength to various insulating layers, and it is inherently difficult to mask and etch a blanket copper layer into intricate circuit structures. Copper is also more resistant than aluminum to electromigration, a quality that grows in importance as wire widths decrease.

The invention addresses the creation of an inductor on the surface of a semiconductor substrate using damascene processes. The application of the damascene process continues to gain wider attention for this application, most notably in the process of copper metalization due to the difficulty of copper deposition where a damascene plug penetrates deep into very small, sub-half micron, Ultra Large Scale Integrated (ULSI) devices. While copper has become important for the creation of multilevel interconnections, copper lines frequently show damage after CMP and clean. This in turn causes problems with planarization of subsequent layers that are deposited over the copper lines, since these layers may now be deposited on a surface of poor planarity. Isolated copper lines or copper lines that are adjacent to open fields are susceptible to damage. Poor copper gap fill together with subsequent problems of etching and planarization are suspected as the root causes for these damages. Where overpolish is required, the problem of damaged copper lines becomes even more severe.

One of the major challenges that must be faced in the creation of discrete passive components (using digital processing procedures and equipment) is that these components are potentially large in size and can therefore not readily be integrated into digital devices that typically have feature sizes approaching the sub-micron range. The main components that offer this challenge are capacitors and inductors, since both these components can be of considerable size.

Inductors can for instance be applied, concurrent with digital processing capabilities, in the field of modern mobile communication that makes use of compact high-frequency equipment. Continued improvements in the performance characteristics of this equipment has been achieved. Further improvements will place continued emphasis on lowering the power consumption of the equipment, on reducing the size of the equipment, on increasing the frequency of the applications and on creating low noise levels. One of the main applications of semiconductor devices in the field of mobile communication is the creation of Radio Frequency (RF) amplifiers. RF amplifiers contain a number of standard components, a major function of a typical RF amplifier is a tuned circuit that contains inductive and capacitive components. Tuned circuits form, dependent on and determined by the values of their inductive and capacitive components, an impedance that is frequency dependent. The tuned circuit typically presents either a high or a low impedance for signals of a certain frequency. The tuned circuit can therefore either reject or pass and further amplify components of an analog signal, based on the frequency of that component. The tuned circuit can in this manner be used as a filter to filter out or remove signals of certain frequencies or to remove noise from a circuit configuration that is aimed at processing analog signals. The tuned circuit can also be used to form a high electrical impedance by using the LC resonance of the circuit and to thereby counteract the effect of parasitic capacitances that are part of a circuit. One of the problems that is encountered when creating an inductor on the surface of a semiconductor substrate is that the self-resonance that is caused by the parasitic capacitance between the (spiral) inductor and the underlying substrate will limit the use of the inductor at high frequencies. As part of the design of such an inductor it is therefore of importance to reduce the capacitive coupling between the created inductor and the underlying substrate.

Typically, inductors that are created on the surface of a substrate are of a spiral shape, the spiral is created in a plane that is parallel with the plane of the surface of the substrate. Conventional methods that are used to create the inductor on the surface of a substrate suffer several limitations. Most high Q inductors form part of a hybrid device configuration or of Monolithic Microwave Integrated Circuits (MMIC's) or are created as discrete components, the creation of which is not readily integratable into a typical process of Integrated Circuit manufacturing. It is clear that, by combining the creation on one semiconductor monolithic substrate of circuitry that is aimed at both the function of analog data manipulation and analog data storage and the function of digital data manipulation and digital data storage, a number of significant advantages can be achieved. Such advantages include the reduction of manufacturing costs and the reduction of power consumption by the combined functions. The spiral form of the inductor that is created on the surface of a semiconductor substrate however results, due to the physical size of the inductor, in parasitic capacitances between the inductor wiring and the underlying substrate. These parasitic capacitances have a serious negative effect on the functionality of the created LC circuit by sharply reducing the frequency of resonance of the tuned circuit of the application. Parasitic capacitances have a serious negative effect on the functionality of the created LC circuit by sharply reducing the frequency of resonance of the tuned circuit of the application. More seriously, the inductor-generated electromagnetic field will induce eddy currents in the underlying resistive silicon substrate, causing a significant energy loss that results in low Q inductors.

The performance parameter of an inductor is typically indicated is the Quality (Q) factor of the inductor, The quality factor Q of an inductor is defined as $Q=Es/El$, wherein Es is the energy that is stored in the reactive portion of the component while El is the energy that is lost in the reactive portion of the component. The Q value of an inductor can also be expressed with the equation $Q=W_0L/R$ where $W_0$ is the resonant frequency of oscillation of the inductor, L is the inductive value and R is the resistance of the inductor. This equation further indicates that, for a given value of $W_0$, the Q value of the inductor increases as the resistance of the inductor is decreased. The higher the quality of the component, the closet the resistive value of the component approaches zero while the Q factor of the component approaches infinity. The quality factor for components differs from the quality that is associated with filters or resonators. For components, the quality factor serves as a measure of the purity of the reactance (or the susceptance) of the component, which can be degraded due to parasitics. In an actual configuration, there are always some physical resistors that will dissipate power, thereby decreasing the power that can be recovered. The quality factor Q is dimensionless. A Q value of greater than 100 is considered very high for discrete inductors that are mounted on the surface of Printed Circuit Boards. For inductors that form part of an integrated circuit, the Q value is typically in the range between about 3 and 10.

In creating an inductor on a monolithic substrate on which additional semiconductor devices are created, the parasitic capacitances that occur as part of this creation limit to about 10 the quality factor that can be achieved for the inductor using the conventional silicon process. This limitation is, for many applications, not acceptable. Dependent on the frequency at which the LC circuit is designed to resonate, significantly larger values of quality factor, such as for instance 100 or more, must be available. Prior Art has in this been limited to creating values of higher quality factors as separate units, and in integrating these separate units with the surrounding device functions. This negates the advantages that can be obtained when using the monolithic construction of creating both the inductor and the surrounding devices on one and the same semiconductor substrate. The non-monolithic approach also has the disadvantage that additional wiring is required to interconnect the sub-components of the assembly, thereby again introducing additional parasitic capacitances and resistive losses over the interconnecting wiring network. For many of the applications of a RF amplifier, such as portable battery powered applications, power consumption is at a premium and must therefore be as low as possible. By raising the power consumption, the effects of parasitic capacitances and resistive power loss can be partially compensated, but there are limitations to even this approach. These problems take on even greater urgency with the rapid expansion of wireless applications, such as portable telephones and the like. Wireless communications is a rapidly expanding market, where the integration of RF integrated circuits is one of the most important challenges. One of the approaches is to significantly increase the frequency of operation to for instance the range of 10 to 100 GHz. For such high frequencies, the value of the quality factor obtained from silicon-based inductors is significantly degraded. For applications in this frequency range, monolithic inductors have been researched using other than silicon as the base for the creation of the inductors. Such monolithic inductors have for instance been created using sapphire or GaAs as a base. These inductors have a considerably lower parasitic capacitance than their silicon counterparts and therefore provide higher frequencies of resonance of the LC circuit. Where however more complex applications are required, the need still exists to create inductors using silicon as a substrate. For those applications, the approach of using a base material other than silicon has proven to be too cumbersome while for instance GaAs as a medium for the creation of semiconductor devices is as yet a technical challenge that needs to be addressed. It is known that GaAs is a semi-insulating material at high frequencies, reducing the electromagnetic losses that are incurred in the surface of the GaAs substrate, increasing the Q value of the inductor created on the GaAs surface. GaAs RF chips however are expensive, a process that can avoid the use of GaAs RF chips therefore offers the benefit of cost advantage.

A number of different approaches have been used to incorporate inductors into a semiconductor environment without sacrificing device performance due to substrate losses. One of these approaches has been to selective remove (by etching) the silicon underneath the inductor (using methods of micro-machining) thereby removing substrate parasitic effects. Another method has been to use multiple layers of metal (such as aluminum) interconnects or of copper damascene interconnects.

Other approaches have used a high resistivity silicon substrate thereby reducing resistive losses in the silicon substrate. Resistive substrate losses in the surface of the underlying substrate form a dominant factor in determining the Q value of silicon inductors. Further, biased wells have been proposed underneath a spiral conductor, this again aimed at reducing inductive losses in the surface of the substrate. A more complex approach has been to create an active inductive component that simulates the electrical properties of an inductor as it is applied in active circuitry. This latter approach however results in high power consumption by the simulated inductor and in noise performance that is unacceptable for low power, high frequency applications. All of these approaches have as common objectives to enhance the quality (Q) value of the inductor, to increase the frequency of the LC self-resonance thereby increasing the frequency range over which the inductor can be used, and to reduce the surface area that is required for the creation of the inductor.

When the geometric dimensions of the Integrated Circuits are scaled down, the cost per die is decreased while some aspect,s of performance are improved. The metal connections which connect the Integrated Circuit to other circuit or system components become of relative more importance and have, with the further miniaturization of the IC, an increasingly negative impact on circuit performance. The parasitic capacitance and resistance of the metal interconnections increase, which degrades the chip performance significantly. Of most concern in this respect is the voltage drop along the power and ground buses and the RC delay of the critical signal paths. Attempts to reduce the resistance by using wider metal lines result in higher capacitance of these wires.

One of the approaches of increasing the Q value of an inductor is, as previously highlighted, to reduce the resistance of the inductor. The invention provides a method for the reduction of the resistance of an inductor, increasing the Q value of the inductor.

U.S. Pat. No. 6,054,329 (Burghartz et al.) show a Cu inductor with CMP.

U.S. Pat. No. 6,030,877 (Lee et al.) and U.S. Pat. No. 5,801,100 (Lee et al.) show copper inductors formed using plating processes.

U.S. Pat. No. 5,652,173 (Kirn) shows a Cu inductor with CMP.

SUMMARY OF THE INVENTION

A principle objective of the invention is to increase the Q value of an inductive component that is created over the surface of a semiconductor substrate.

Another objective of the invention is to increase the Q value of an inductive component that is created over the surface of a semiconductor substrate without requiring the use of additional steps of mask exposures.

In accordance with the objectives of the invention a new method is provided for the creation of an inductive over the surface of a semiconductor substrate. A first layer of metal is created in a layer of dielectric, a second layer of metal is created overlying the first layer of metal. The first layer of metal combined with the second layer of metal form an inductor of increased height, reducing the resistivity of the inductor, increasing the Q value of the inductor. The new method of creating an inductor can be combined with creating contact points that connect to contact points in the active region of the surface of a semiconductor substrate.

a second stop layer has been deposited over the surface of the first layer of dielectric the second etch stop layer has been patterned and etched, creating openings in the second etch stop layer that align with the first pattern of openings the openings created in the second etch stop layer have been filled with a conductive material, the surface of the second etch stop layer has been planarized a second layer of dielectric has been deposited over the surface of the second stop layer a second layer of photoresist has been deposited over the surface of the second layer of dielectric the second layer of photoresist has been patterned and etched, creating a second pattern of openings in the second layer of dielectric that aligns with the first pattern of openings created in the first layer of dielectric.

Figure 5:
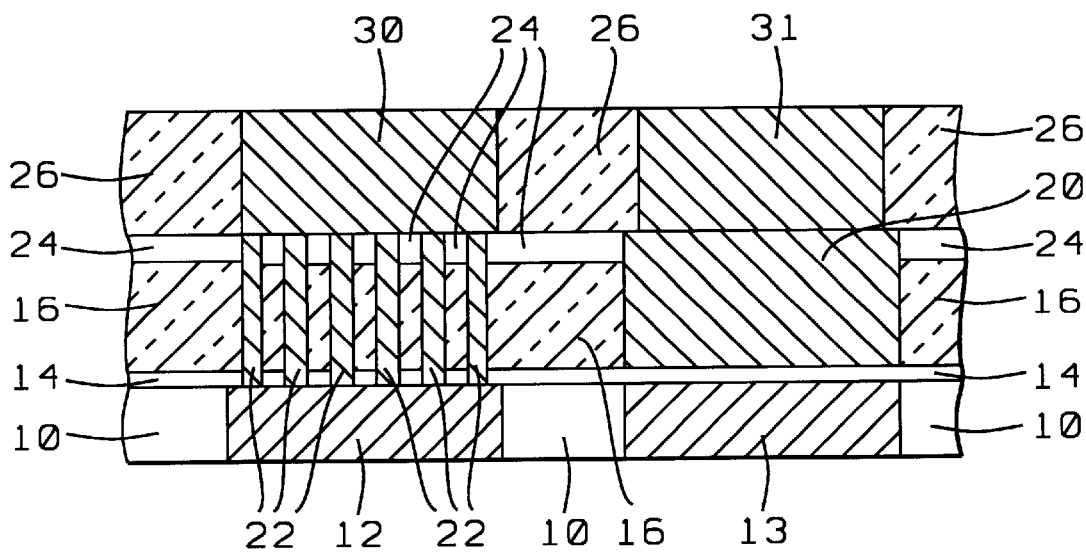

FIG. 5 shows a cross section after the patterned second layer of dielectric has been removed from the surface of the second layer of dielectric, the second pattern of openings has been filled with a conductive material.

Figure 6:
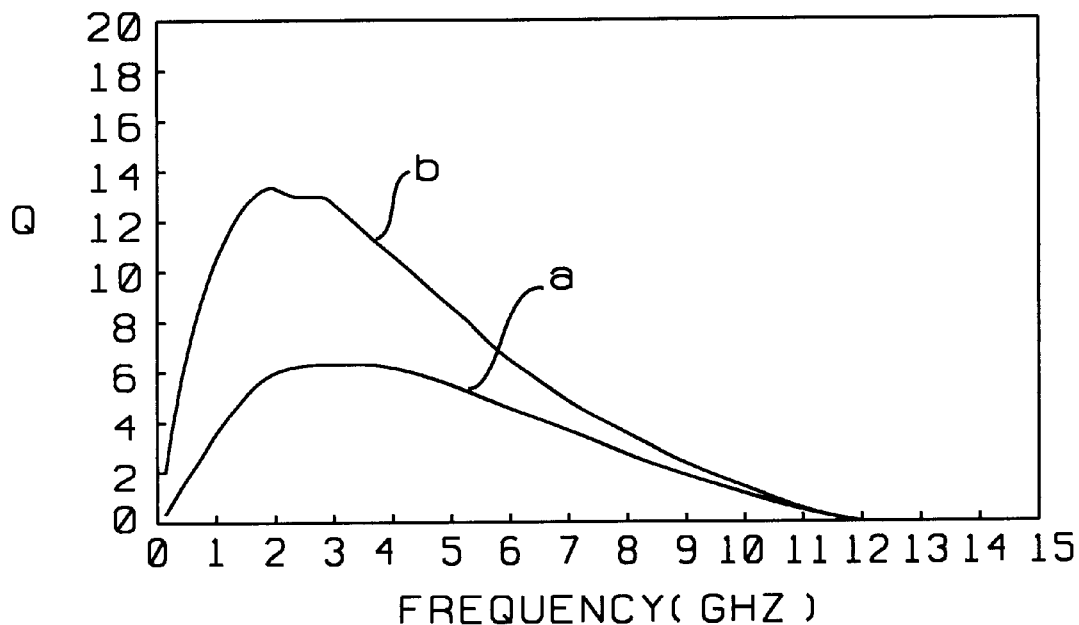

FIG. 6 shows in graphic form the Q value of the inductor of the invention as a function of frequency of application (of the inductor) and compared with a conventional aluminum inductor.

Figure 7:
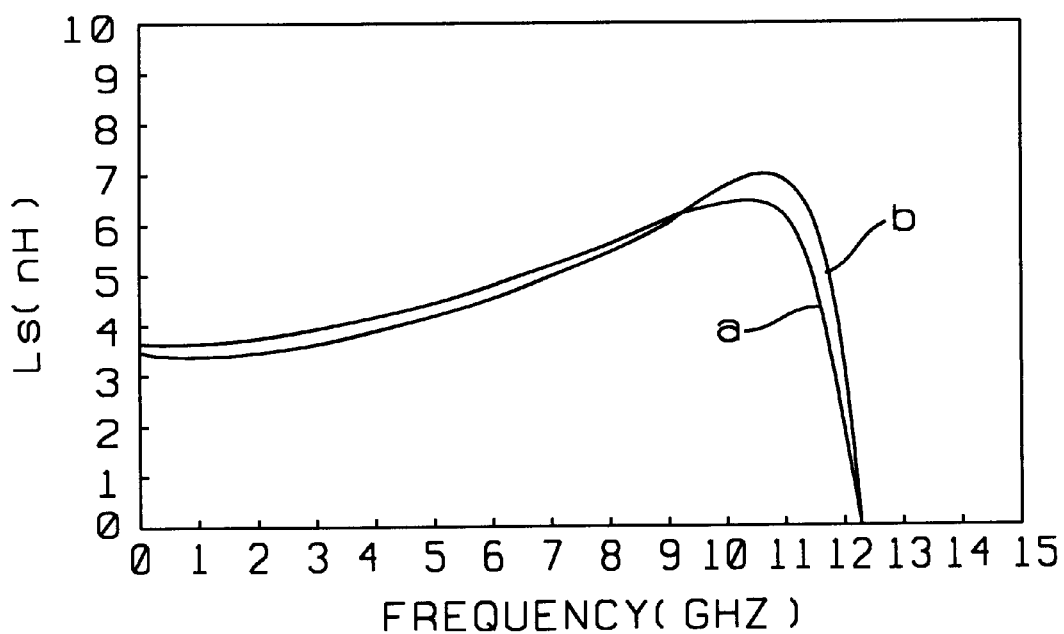

FIG. 7 shows in graphic form the inductive value of the inductor of the invention as a function of frequency (of application of the inductor) and compared. with a conventional aluminum inductor.

DESCRIPTION OF THE PREFERRED EMBODIMENTS

For ease of understanding and to avoid therefrom following potential confusion, the following terminology is introduced that defines the various layers of openings:

the invention differentiates between substrate surface areas that have active devices with electrical contact points and a surface areas over which an inductor is to be created having a contact point patterns that are created above the active surface of the substrate are referred to as first patterns, patterns that are created above the inductive contact point are referred to as second patterns the naming convention of this application will use openings that are created in a first layer of dielectric as the original openings or first openings and will base the naming of additional openings with respect to the first openings openings that are created in a first layer of dielectric are referred to as first openings openings that are created in an (etch stop) layer underlying the first layer of dielectric are referred to as first openings downward extended openings created in an (etch stop) layer overlying the first layer of dielectric are referred to as first openings first upward extended openings that are created overlaying the first opening first upward extended openings will be referred to as first openings second upward extended.

With this terminology in place, it should be possible to visualize every opening that is created in two overlying layers of dielectric with interposed etch stop layers using different patterns for these openings. For instance a first opening second upward extended created in accordance with the second pattern is an opening in the second layer of dielectric overlying the contact point in the surface of the substrate to which an inductor must be connected.

Figure 1:
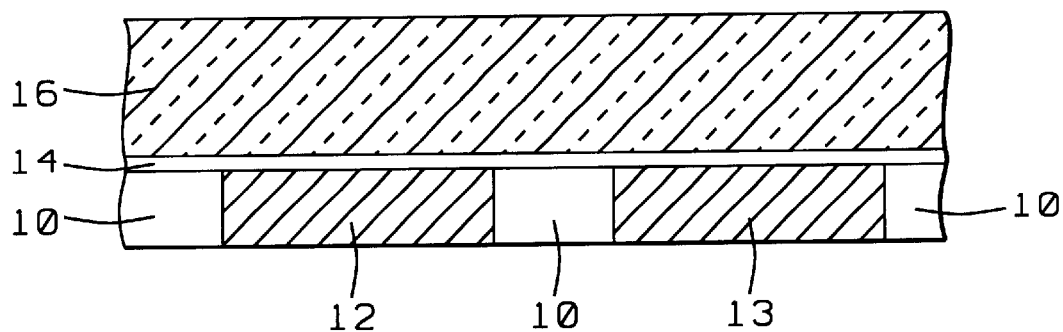
FIG. 1 shows a cross section of a semiconductor substrate in which points of electrical contact have been provided, a first etch stop layer has been deposited over the surface of the substrate, a first layer of dielectric has been deposited over the surface of the first stop layer.

Referring now specifically to FIG. 1, there is shown a cross section of a semiconductor substrate 10 in which points 12 and 13 of electrical contact have been provided, a first etch stop layer 14 has been deposited over the surface of the substrate 10, a first layer 16 of dielectric has been deposited over the surface of the first stop layer.

Points of electrical contact 12 and 13 are significantly different in that points of electrical contact 12 overlay and are points of electrical contact to active devices that have been created in or on the surface of the substrate 10. Point 13 of electrical contact by contrast is the point of electrical contact in or on the surface of substrate 10 to which an inductor is to be connected. Point 12 of electrical contact is therefore provided in the active region of the surface of substrate 10, point 13 of electrical contact is provided in the inductor region of the surface of substrate 10. The preferred conductive material that is used for the points 12 and 13 of electrical contact is copper.

Layer 14 is an etch stop layer containing silicon nitride and is typically deposited using LPCVD or PECVD procedures, at a temperature between about 200 and 800 degrees C., to a thickness between about 200 and 5000 Angstrom employing SiN or $SiO_xN_y$ as a silicon source material and ammonia as a nitrogen source material. The preferred thickness of the etch stop layer 14 of the invention is about 800 Angstrom thick in view of the pattern etch (FIG. 2) for which the etch stop layer 14 is provided.

Layer 16 is a layer of dielectric that is deposited over the surface of the etch stop layer 14. Semiconductor devices are typically fabricated by the creation of a multiplicity of conductive regions on the surface of a semiconductor substrate. These conductive regions are isolated from each other by dielectric layers. Dielectric layers can contain a large number of materials such as silicon dioxide ("oxide") or silicon nitride ("nitride"), tetra-ethyl-ortho-silicate (TEOS) based oxides, boro-phosphate-silicate-glass (BPSG), phospho-silicate-glass (PSG), boro-silicate-glass (BSG), oxide-nitride-oxide (ONO), tantalum pentoxide ($Ta_2O_5$), plasma enhanced silicon nitride (PSiNx), titanium oxide, oxynitride, a low dielectric constant material, such as hydrogen silsesquioxane, HDP-FSG (high-density-plasma fluorine-doped silicide glass) is a dielectric that has a lower dielectric constant than regular oxide. Some of the dielectrics, such as silicon dioxide, can be grown on the surface of the substrate or can be physically deposited by for instance a sputtering process or by other chemical methods of dielectric deposition. The native properties of a dielectric can further be altered by doping the dielectric layer by either n-type dopants such as arsenic and phosphorous or p-type dopants such as indium or boron. The method of forming the dielectric layer and the doping that is applied to this layer is determined by various device and processing considerations.

The preferred dielectrics to be used for the deposition of layer 16 are silicon dioxide (doped or undoped), silicon oxynitride, parylene or polyimide, spin-on-glass, plasma oxide or LPCVD oxide.

The deposition of the layer 16 of dielectric uses conventional deposition technology and can, for instance, be deposited using PECVD procedures at a temperature of between about 350 and 450 degrees C. to a thickness between about 5000 and 10,000 Angstrom using TEOS as a source.

Figure 2:
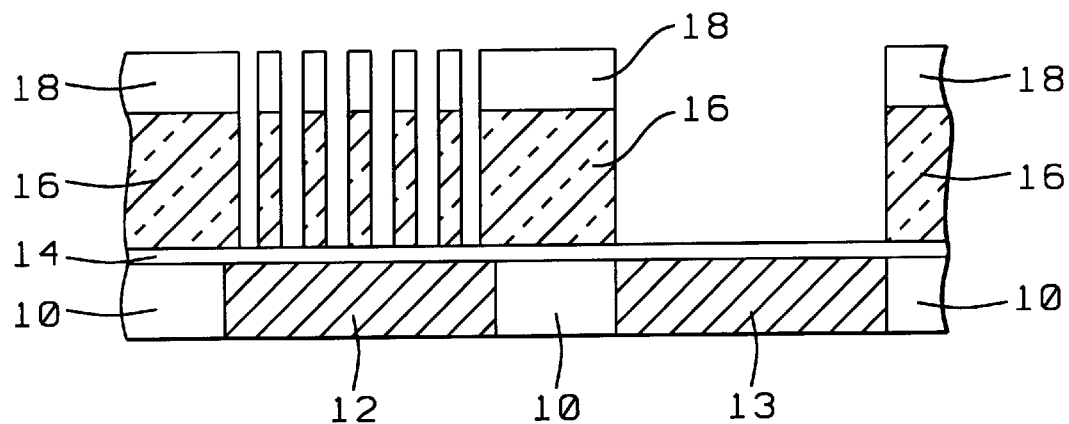
FIG. 2 shows a cross section after a first layer of photoresist has been deposited over the surface of the first layer of dielectric, the first layer of photoresist has been patterned and etched, the underlying first layer of dielectric has been etched creating a first pattern of openings overlying the points of electrical contact provided in the surface of the substrate.

FIG. 2 shows the creation of a photoresist mask on the surface of the layer 16 of dielectric, for the formation of a pattern of openings in the layer 16 of dielectric that alxgn with the points 12 and 13 of electrical contact in the surface of substrate 10. The process of deposition and patterning the layer 18 of photoresist uses conventional methods of photolithography and masking. Layer 18 of photoresist can be etched by applying $O_2$ plasma and then wet stripping by using $H_2SO_4$, $H_2O_2$ and $NH_4OH$ solution.

The typical process of creating a pattern of openings starts with the deposition of a layer of dielectric (the dielectric into which the openings are to be made) over which a layer of photoresist is deposited. The layer of photoresist is patterned in accordance with the desired pattern of openings, the photoresist is removed from above the layer of dielectric in accordance with the pattern for the to be created openings. The dielectric layer is then etched, that is the dielectric is removed in accordance with the pattern of the openings. A dry etch is typically performed, exposing the dielectric layer to a plasma that is created by using one or more gasses that expose the surface of the oxide where the photoresist has been removed. For etchant gasses, halocarbons or their compounds can be used. Etchants can contain dimethylsulfoxide (DMDO) or monoethanolamine (MEA). Etching gases are typified by $CHF_3$ and $CF_4$ and the energy of incident ions of $CF_x^+$ released therefrom. $H_2$ can be added to the etching gas. Etchant gasses can contain a mixture of fluorocarbon compounds and a halogen compound. Etchant gasses can also contain carbonyl, thionyl, sulfucyl, nitrosyl, nitryl and $C_2HF_5$. Etchant gasses can further contain $SiCl_4$ and $SiF_4$ in combination as a plasma etch. Etchant gasses can also contain carbonyl, thionyl, sulfucyl, nitrosyl, nitryl and $C_2HF_5$. Etchant gasses can further contain $SiCl_4$ and $SiF_4$ in combination as a plasma etch. The type of etchant that is applied for a particular step of etching openings will be determined by the processing and functional application of the openings within the overall device structure.

The width of the openings that are created in the first layer 16 of dielectric and that align with the active region 12 in the surface of the substrate 10 is about 0.36 um, the width of the opening that is created in the first layer 16 of dielectric and that aligns with the inductive region 13 in the surface of the substrate 10 is about 15.0 um.

As part of the processing sequence of the invention, a barrier layer can be deposited at this point. It has previously been pointed out that copper suffers from high diffusivity into common insulating materials such as silicon oxide and oxygen-containing polymers. For instance, copper tends to diffuse into polyimide during high temperature processing of the polyimide. This causes severe corrosion of the copper and the polyimide due to the copper combining with oxygen in the polyimide. This corrosion may result in loss of adhesion, delamination, voids, and ultimately a catastrophic failure of the component. Copper interconnects should therefore be encapsulated by at least one diffusion barrier to prevent diffusion into the silicon dioxide layer. As mentioned, silicon nitride is a diffusion barrier to copper, but the prior art teaches that the interconnects should not lie on a silicon nitride layer because it has a high dielectric constant compared with silicon dioxide. The high dielectric constant causes an undesired increase in capacitance between the interconnect and the substrate. A typical barrier layer is formed deposited using rf. sputtering of titanium nitride, tantalum, tungsten, niobium, molybdenum, Ti/TiN or Ti/W and is more preferably formed from TiN. The barrier layer can also be used to improve the adhesion of the subsequent overlying tungsten layer. A barrier layer is preferably about 100 and 500 angstrom thick and more preferably about 300 angstrom thick.

The invention can further be enhanced by improving the adhesion of a copper interconnect line to the underlying points of electrical contact 12 and 13. For this purpose, a seed layer is deposited over the barrier layer. A seed layer can be deposited using a sputter chamber or an Ion Metal Plasma (IMP) chamber at a temperature of between about 0 and 300 degrees C. and a pressure of between about 1 and 100 mTorr, using copper or a copper alloy as the source at a flow rate of between about 10 and 400 sccm and using argon as an ambient gas. The minimum thickness of a seed layer is about 50 Angstrom, this thickness is required achieve a reliable gap fill.

To avoid distortion of the photoresist patterns that are used to create the openings on the dielectric layer, Anti Reflective Coating (ARC) is frequently applied over the surface of the openings. Photolithographic patterning problems can be caused by the increase in use of highly reflective materials such as polysilicon, aluminum, and metal suicides in the creation of the semiconductor device. These materials can cause unwanted reflections from the underlying layers resulting in distortion of the creation of the openings. Anti-reflective coatings (ARC's) are used to minimize the adverse impact due to reflectance from these reflective materials. In many instances, these ARC's are conductive materials which are deposited as a blanket layer on top of metal and simultaneously patterned with the metal to form interconnects. A problem with these ARC's is that many of the metals cannot be used in applications such as dual damascene, wherein the metal layer is not patterned. In a dual damascene application, openings are formed in the interlayer dielectric, and the metal is blanket deposited in those openings and subsequently polished back to form a planar inlaid plug. In such application, the metal layer is never etched and therefore, any conductive ARC a top of the inlaid metal would cause the metal plugs to be electrically short-circuited together through the conductive ARC.

After the pattern of openings has been created in layer 16 of dielectric, the layer 18 of photoresist must be removed from above the surface of the patterned layer 16 of dielectric. One of the frequently used methods for stripping of photoresist from a surface uses sulfuric acid ($H_2SO_4$) and mixtures of $H_2SO_4$ with other oxidizing agents such as hydrogen peroxide ($H_2O_2$). For instance, a frequently used mixture is seven parts $H_2SO_4$ to three parts of 33% $H_2O_2$ or a mixture of 85% sulfuric acid and 15% nitric acid. Wafers to be stripped of the photoresist can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The above process of photoresist stripping can be preceded by partially removing the photoresist using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Figure 3:
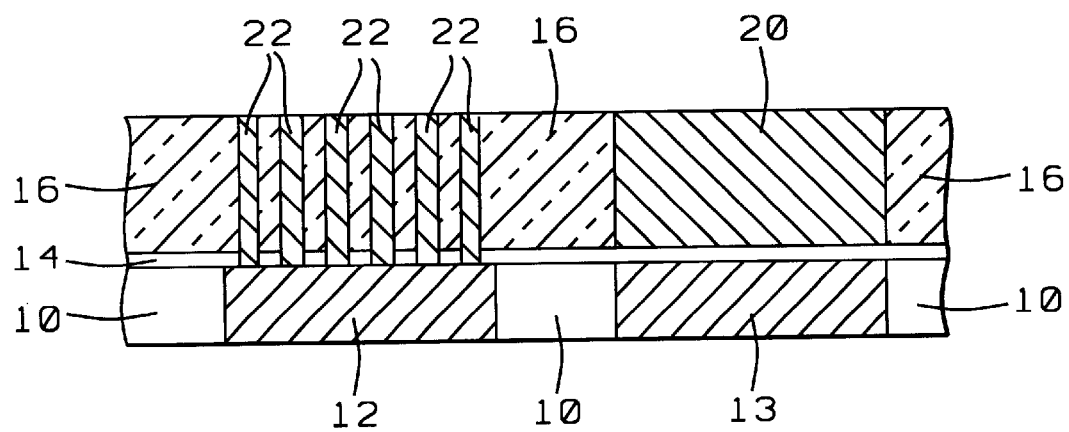
FIG. 3 shows a cross section after the patterned first layer of photoresist has been removed, the openings created in the first layer of dielectric have been extended down through the first etch stop layer and have been filled with a conductive material.

Referring now to FIG. 3, this cross section shows that, at the bottom of the pattern of openings that has been created in the layer 16 of dielectric, the layer 14 of etch stop material has been partially removed. The need for this is obvious since this removal creates the openings in the layer 14 of etch stop through which the points of electrical contact 12 and 13 can be accessed. The etching of a silicon nitride etch stop layer 14 can be performed by applying $Ar/CF_4$ as an etchant, using a commercially available parallel plate RIE etcher or an Electron Cyclotron Resonance (ECR) plasma reactor, at a temperature of between about 120 and 160 degrees C., and a pressure of between about 0.30 and 0.40 Torr, for a time of between about 33 and 39 seconds using a dry etch process.

After the openings have been etched in the layer 14 of etch stop, openings that align with points of electrical contact 12 and 13 and that are etched in accordance with the pattern of openings that has been created in the layer 16 of dielectric, a conductive material such as copper is deposited, filling the openings in layer 16 and layer 14 down to the surface of points 12 and 13 of electrical contact. This process can be performed using the previously highlighted methods of Chemical Vapor Deposition (CVD) or selective electroless plating. To assure critical planarity of the surface of layer 16 after the copper has been deposited inside the openings that have been created in layer 16, it may be required that a step of Chemical Mechanical Polishing is applied to this surface (of layer 16), removing excess copper from above this surface and further planarizing the surface of the conductive plugs that have been formed in the layer 16 of dielectric.

Figure 4:
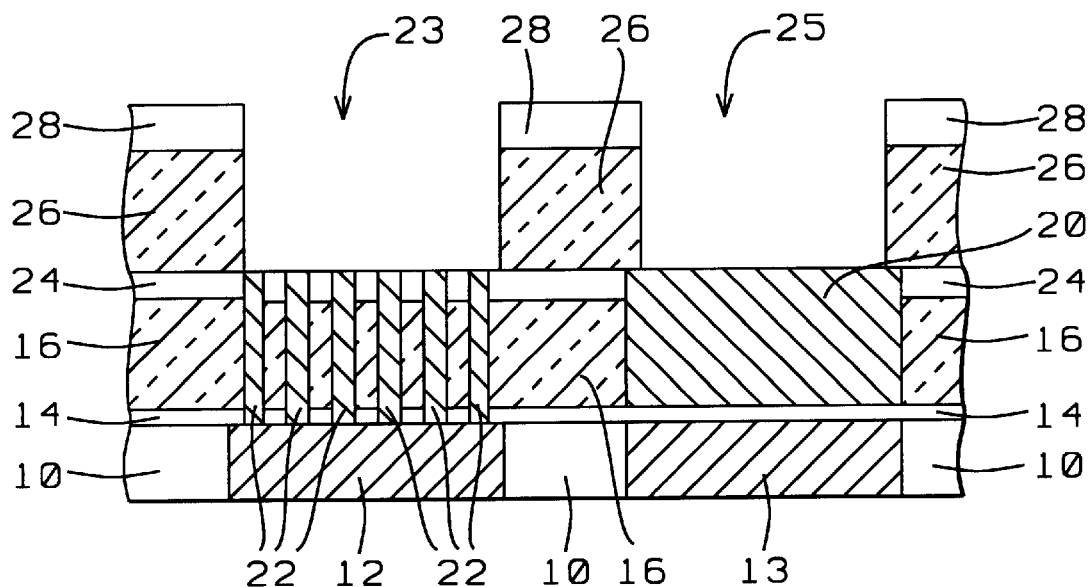
FIG. 4 shows a cross section of the semiconductor surface after.

Processing conditions that can be applied for the processing steps that are highlighted under FIGS. 4 and 5 are similar to the processing conditions that have up to this point applied for the various steps of FIGS. 1 through 3. These processing conditions, since repeated enumeration of such conditions does not contribute to a better understanding of the invention, will not further be repeated.

FIG. 4 shows a cross section of substrate surface 10 after the following processing steps have been completed:

a second stop layer 24 has been deposited over the surface of layer 16 of dielectric, including the surface of the conductive plugs that have been formed in layer 16, openings are etched in layer 24 that align with the underlying pattern of conductive plugs in layer 16, the openings that have been created in the second etch stop layer 24 are filled with copper, optionally the surface of the second etch stop layer is polishing to enhance planarity of the surface of layer 24, a second layer 26 of dielectric is deposited over the surface of the second etch stop layer 24, a layer 28 of photoresist is deposited over the surface of the second layer of dielectric, layer 28 of photoresist is patterned and etched, removing the photoresist from above the surface of the second etch stop layer 24 where this surface contains the etched regions of this second etch stop layer, Layer 26 of second dielectric has been etched in accordance with the pattern that is created in the layer 28 of photoresist.

Processing conditions that apply to the creation of the cross section that is shown in FIG. 4 have, as indicated, previously been highlighted and will therefore not be repeated at this time.

In FIG. 5 is shown a cross section of the substrate that is, starting with the cross section of FIG. 4, arrived at by the processing steps of:

removing the patterned layer 28 (FIG. 4) of photoresist from above the surface of the substrate, filling the openings that have been created in the second layer of dielectric with a conductive material, preferably copper, and optionally, planarizing the surface of the second layer 26 of dielectric after the conductive material has been deposited over the surface of layer 26.

It is clear from the cross section that is shown in FIG. 5, that the invention has created:

a contact plug 30 overlying and electrically connected with the point 12 of electrical contact provided in the surface of substrate 10, and a contact plug 31 overlying and electrically connected with the point 13 of electrical contact provided in the surface of substrate 10.

By creating the overlaying layers 13 and 20 that are the layers of an inductor that is formed over the surface of substrate 10, the thickness of the layers of conductive material that are used for the inductor has been significantly increased, reducing the resistivity of the conductive legs of the inductor, increasing the Q value of the inductor that is created over the surface of substrate 10.

Following is a listing of the preferred thickness of the respective layers that are formed using the invention:

layer 10: 4000 Angstrom,
layer 16: 6500 Angstrom,
layer 18: 2000 Angstrom (photoresist),
layer 26: 15000 Angstrom, and
layer 28: 3000 Angstrom (photoresist)

Since layers 18 and 28 are removed during the processing sequence of the invention, the total thickness of the layer 20/31 that is created equals 4000+6500+15,000 Angstrom or 25,5000 Angstrom in (2.55 um) total. This latter value can be compared with a thickness of 8500 Angstrom (0.85 um) of the original layer (20, FIG. 3) of the conductive leg of the inductor, the value of this thickness has therefore been increased by a factor of three by the invention.

FIGS. 6 and 7 show the results of measurements that have been taken in support of and as validation for the inductor of the invention.

FIG. 6 shows a curve of the Q factor (along the vertical or Y-axis) as a function of frequency (in HGz, along the horizontal or X-axis). The two curves compare the performance of a conventional aluminum inductor (curve a) with the copper inductor of the invention (curve b). It is clear from the measurements that are presented in FIG. 6 that, at the critical frequency of about 2 GHz, the Q value of the copper inductor of the invention is increased by a factor in excess of 2.5, at the critical frequency of about 3 GHz, the Q value of the copper inductor of the invention is increased by a factor of about 2. kMoreover, the improvement in the Q factor of the inductor of the invention remains true even for frequency of application of the inductor up to 12 GHz.

The improvements in Q factor of the inductor of the invention would be of limited value if the inductive value of the inductor of the invention were to be negatively affected (decrease) at a particular frequency. FIG. 7 shows that this is not the case, in fact the inductive value of the inductor of the invention (curve b) is nominally higher than the conventional inductor (curve a) at the (high) frequency of about 10 to 11 GHz. For all other values of frequency under which the inductors are applied, the inductor of the invention maintains its inductive value when compared with the conventional aluminum inductor.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A method of forming a high-Q inductor over the surface of a semiconductor substrate, comprising:

providing a semiconductor substrate, points of electrical contact having been provided in or on the surface of said substrate, said points of electrical contact to be first points of electrical contact in an active surface regions of the surface of said substrate overlying and being in electrical contact with semiconductor devices formed in or on the surface of said substrate, said points of electrical contact further to be second points of electrical contact to which an overlying inductor is to be connected;

depositing a first etch stop layer of the surface of said substrate;

depositing a first layer of dielectric over the first etch stop layer;

creating first openings in said first layer of dielectric and said first etch stop layer that align with and expose said first points of electrical contact provided in or on the surface of said substrate, further creating second openings in said first layer of dielectric and said first etch stop layer that align with and expose said second points of electrical contact provided in or on the surface of said substrate;

depositing a first layer of conductive material over the surface of said first layer of dielectric, filling said first openings, creating first conductive plugs, further filling said second openings, creating second conductive plugs;

depositing a second etch stop layer over the surface of said first layer of dielectric, thereby including the surface of said first and said second conductive plugs;

creating first openings in said second etch stop layer that align with said first conductive plugs, further creating openings in said second etch stop layer that align with said second conductive plugs;

depositing a second layer of conductive material over the surface of said second etch stop layer, filling said first and second openings created in said second etch stop layer;

planarizing the surface of said second layer of conductive material, creating first extended first conductive plugs that penetrate said first etch stop layer it addition to said first layer of dielectric in addition to penetrating said second etch stop layer and that align with said first points of electrical contact provided in or on the surface of said substrate, further creating first extended second conductive plugs that penetrate said first etch stop layer in addition to said first layer of dielectric in addition to penetrating said second etch stop layer and that align with said second points of electrical contact provided in or on the surface of said substrate;

depositing a second layer of dielectric over the surface of said second etch stop layer, including the surface of said first extended first conductive plugs and said first extended second conductive plugs;

creating openings in said second layer of dielectric that align with said first extended first conductive plugs, further creating openings in said second layer of dielectric that align with said first extended second conductive plugs;

depositing a third conductive layer over the surface of said second layer of dielectric, including said openings created in said second layer of dielectric; and planarizing the surface of said third conductive layer, creating second extended first conductive plugs and second extended second conductive plugs, said second extended first conductive plugs and second extended second electric plugs penetrating said first etch stop layer, said first layer of dielectric, said second etch stop layer and said second layer of dielectric, whereby furthermore said second extended first conductive plugs align with said first points of contact provided in or on the surface of said substrate, whereby furthermore said second extended second conductive plugs align with said second points of electrical contact provided in or on the surface of said substrate.

2. The method of claim 1 wherein said points of electrical contact provided in or on the surface of said substrate are contact pads with a thickness of between about 3000 and 5000 Angstrom.

3. The method of claim 1 wherein said first layer of dielectric is deposited to a thickness between about 5000 and 8000 Angstrom.

4. The method of claim 1 wherein said second layer of dielectric is deposited to a thickness between about 13000 and 17000 Angstrom.

5. The method of claim 1 wherein said first layer of conductive material and said second layer of conductive material and said third layer of conductive material comprise copper.

6. A method of forming a high-Q inductor over the surface of a semiconductor substrate by extending the thickness df the dielectric layer in which the inductor is created, comprising:

providing a semiconductor substrate, points of electrical contact having been provided in or on the surface of said substrate, said points of electrical contact to be first points of electrical contact in an active surface regions of the surface of said substrate overlying and being in electrical contact with semiconductor devices formed in or on the surface of said substrate, said points of electrical contact further to be second points of electrical contact to which an overlying inductor is to be connected;

creating a first layer of first and second conductive plugs in a first layer of etch stop and a thereover deposited first layer of dielectric, whereby first layer of said first conductive plugs align with said first points of electrical contact in an active surface regions of the surface of said substrate, whereby further said first layer of second conductive plugs align with said second points of electrical contact in an active surface regions of the surface of said substrate; and creating a second layer of first and second conductive plugs in a second layer of etch stop and a thereover deposited second layer of dielectric, whereby said second etch stop layer is deposited over said first layer of dielectric, whereby said second layer of first conductive plugs align with said first points of electrical contact in an active surface regions of the surface of said substrate, whereby further said second layer of second conductive plugs align with said second points of electrical contact in an active surface regions of the surface of said substrate.

7. The method of claim 6 wherein said points of electrical contact provided in or on the surface of said substrate are contact pads with a thickness of between about 3000 and 5000 Angstrom.

8. The method of claim 6 wherein said first layer of dielectric is deposited to a thickness between about 5000 and 8000 Angstrom.

9. The method of claim 6 wherein said second layer of dielectric is deposited to a thickness between about 13000 and 17000 Angstrom.

10. The method of claim 6 wherein said conductive plugs in said first layer of conductive plugs and said conductive plugs in said second layer of conductive plugs comprise copper.

11. The method of claim 6 with the additional step of planarizing the surface of said conductive plugs after said conductive plugs have been formed using methods of chemical Mechanical Planarization.

12. The method of claim 6 wherein said method is further extended to comprise a sequential and multiple sequence of deposition of a layer of etch stop material over which a layer of dielectric is deposited, after which conductive plugs comprising first conductive plugs and second conductive plugs are created penetrating said etch stop layer and said layer of dielectric whereby said first conductive plugs align with said first points of electrical contact in an active surface regions of the surface of said substrate, whereby further said second conductive plugs align with said second points of electrical contact provided in the surface of said substrate.

13. The method of claim 12 wherein said layers of dielectric are deposited to a thickness of between about 13000 and 17000 Angstrom.

14. The method of claim 12 wherein said conductive plugs comprise copper.

15. A method of forming a high-Q inductor over the surface of a semiconductor substrate, comprising:

providing a semiconductor substrate, points of electrical contact having been provided in or on the surface of said substrate, said points of electrical contact to be points of electrical contact to which an overlying inductor is to be connected;

depositing a first etch stop layer of the surface of said substrate;

depositing a first layer of dielectric over the first etch stop layer;

patterning and etching said first layer of dielectric and said first etch stop creating first openings in said first layer of dielectric and said first etch stop layer that align with and expose said points of electrical contact provided in or on the surface of said substrate;

depositing a first layer of conductive material over the surface of said first layer of dielectric, filling said openings creating first conductive plugs;

depositing a second etch stop layer over the surface of said first layer of dielectric, thereby including the surface of said conductive plugs;

patterning and etching said second etch stop layer, creating openings in said second etch stop layer that align with said first conductive plugs;

depositing a second layer of conductive material over the surface of said second etch stop layer, filling said openings created in said second etch stop layer;

planarizing the surface of said second layer of conductive material down to at least the surface of said second etch stop layer using methods of Chemical Mechanical Polishing, creating second conductive plugs that penetrate said first etch stop layer in addition to said first layer of dielectric in addition to penetrating said second etch step layer and that align with said points of electrical contact provided in or on the surface of said substrate;

depositing a second layer of dielectric over the surface of said second etch stop layer, including the surface of said second conductive plugs;

patterning and etching said second layer of dielectric, creating openings in said second layer of dielectric that align with said second conductive plugs;

depositing a third conductive layer over the surface of said second layer of dielectric, including said openings created in said second layer of dielectric; and planarizing the surface of said second layer of dielectric, creating extended conductive plugs penetrating said first etch stop layer, said first layer of dielectric, said second etch stop layer and said second layer of dielectric, whereby said extended conductive plugs align with said points of contact provided in or on the surface of said substrate.

16. The method of claim 15 wherein said points of electrical contact provided in or on the surface of said substrate are contact pads with a thickness of between about 3000 and 5000 Angstrom.

17. The method of claim 15 wherein said first layer of dielectric is deposited to a thickness between about 5000 and 8000 Angstrom.

18. The method of claim 15 wherein said second layer of dielectric is deposited to a thickness between about 13000 and 17000 Angstrom.

19. The method of claim 15 wherein said first layer of conductive material and said second layer of conductive material and said third layer of conductive material comprise copper.

20. A method of forming a high-Q inductor over the surface of a semiconductor substrate by extending the thickness of the dielectric layer in which the inductor is created, comprising;

providing a semiconductor substrate, points of electrical contact having been provided in or on the surface of said substrate, said points of electrical contact to be points of electrical contact to which an overlying inductor is to be connected;

creating a first layer of conductive plugs in a first layer of etch stop and a thereover deposited first layer of dielectric, whereby first layer of conductive plugs align with said points of electrical contact in surface regions of the surface of said substrate to which inductors are to be connected; and creating a second layer of conductive plugs in a second layer of etch stop and a thereover deposited second layer of dielectric, said second layer of etch stop to be deposited over the surface of said first layer of dielectric, whereby said second layer of second conductive plugs aligns with said points of electrical contact to which an overlying inductor is to be connected.

21. The method of claim 20 wherein said points of electrical contact provided in or on the surface of said substrate are contact pads with a thickness of between about 3000 and 5000 Angstrom.

22. The method of claim 20 wherein said first layer of dielectric is deposited to a thickness between about 5000 and 8000 Angstrom.

23. The method of claim 20 wherein said second layer of dielectric is deposited to a thickness between about 13000 and 17000 Angstrom.

24. The method of claim 20 wherein said conductive plugs in said first layer of conductive plugs and said conductive plugs in said second layer of conductive plugs comprise copper.

25. The method of claim 20 wherein said method is further extended to comprise the sequential deposition of layer of etch stop material over which a layer of dielectric is deposited, after which conductive plugs are created penetrating said etch stop layers and said layers of dielectric whereby said conductive plugs align with said points of electrical contact to which an overlying inductor is to be connected.

26. The method of claim 25 wherein said layers of dielectric are deposited to a thickness of between about 13000 and 17000 Angstrom.

27. The method of claim 25 wherein said conductive plugs comprise topper.

28. The method of claim 1 wherein said points of electrical contact provided in or on the surface of said substrate comprise copper.

29. The method of claim 6 wherein said points of electrical contact provided in or on the surface of said substrate comprise copper.

30. The method of claim 15 wherein said points of electrical contact provided in or on the surface of said substrate comprise copper.

31. The method of claim 20 wherein said points of electrical contact provided in or on the surface of said substrate comprise copper.

* * * * *